United States Patent
Nagatani et al.

(10) Patent No.: US 9,273,394 B2
(45) Date of Patent: Mar. 1, 2016

(54) PLASMA PROCESSING APPARATUS AND DIAGNOSIS METHOD THEREOF

(75) Inventors: Masahiro Nagatani, Kudamatsu (JP); Yoshifumi Ogawa, Hikari (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 651 days.

(21) Appl. No.: 13/612,919

(22) Filed: Sep. 13, 2012

(65) Prior Publication Data

US 2014/0041804 A1  Feb. 13, 2014

(30) Foreign Application Priority Data

Aug. 7, 2012 (JP) .................................. 2012-174522

(51) Int. Cl.
| | |
|---|---|
| *G01F 7/00* | (2006.01) |
| *B05C 11/00* | (2006.01) |
| *C23C 16/455* | (2006.01) |
| *C23C 16/52* | (2006.01) |
| *G05D 7/06* | (2006.01) |

(52) U.S. Cl.
CPC ............ *C23C 16/45561* (2013.01); *C23C 16/52* (2013.01); *G05D 7/0658* (2013.01)

(58) Field of Classification Search
None
See application file for complete search history.

(56) References Cited

U.S. PATENT DOCUMENTS

| | | | |
|---|---|---|---|
| 6,712,085 B2 * | 3/2004 | Weissgerber et al. | 137/12 |
| 7,674,375 B2 * | 3/2010 | Gerhardt et al. | 210/198.2 |
| 8,305,582 B2 * | 11/2012 | Anderson et al. | 356/436 |
| 8,661,847 B2 * | 3/2014 | Brockmann | 62/617 |
| 8,728,239 B2 * | 5/2014 | Bauer et al. | 118/715 |
| 8,746,269 B2 * | 6/2014 | Beeby et al. | 137/9 |
| 8,790,529 B2 * | 7/2014 | Hayasaka et al. | 216/58 |
| 2004/0050325 A1 * | 3/2004 | Samoilov et al. | 118/715 |
| 2005/0005994 A1 * | 1/2005 | Sugiyama et al. | 141/4 |
| 2005/0109698 A1 * | 5/2005 | Gerhardt et al. | 210/656 |
| 2006/0097644 A1 * | 5/2006 | Kono et al. | 315/111.21 |
| 2009/0173136 A1 * | 7/2009 | Brockmann | 73/1.58 |

FOREIGN PATENT DOCUMENTS

JP   2007-214406   8/2007

* cited by examiner

*Primary Examiner* — Allan Olsen
(74) *Attorney, Agent, or Firm* — Baker Botts L.L.P.

(57) ABSTRACT

A plasma processing apparatus includes at least three gas supply lines connected to a process chamber in parallel to allow a gas to flow therethrough, and at least three flow-rate controllers provided on the gas supply lines to detect the flow rate of the gas flowing through each of the flow-rate controllers to control the flow rate to a set value and a diagnosis method. The apparatus has a function of splitting and supplying a gas controlled to a predetermined flow rate by the third flow-rate controller, to a first flow-rate controller for the smallest detectable range of the three flow-rate controllers and to a second flow-rate controller, in order to test the operation of the control of the flow rate of the first flow-rate controller, based on the value obtained from the flow rate of the gas flowing through the second flow-rate controller and the predetermined flow rate.

5 Claims, 6 Drawing Sheets

|  | GAS TYPE | MAXIMUM FLOW RATE |
|---|---|---|
| GAS FLOW-RATE CONTROLLER A | N2 | 20 L/min |
| GAS FLOW-RATE CONTROLLER B | Ar | 20 L/min |
| GAS FLOW-RATE CONTROLLER C | H2 | 5 L/min |

|  | GAS TYPE | CONVERSION FACTOR |
|---|---|---|
| GAS SUPPLY SOURCE A | N2 | 1.0 |
| GAS SUPPLY SOURCE B | Ar | 1.4 |
| GAS SUPPLY SOURCE C | H2 | 1.0 |

PLASMA PROCESSING APPARATUS AND DIAGNOSIS METHOD THEREOF

CLAIM OF PRIORITY

The present application claims priority from Japanese Patent Application JP2012-174522 filed on Aug. 7, 2012, the content of which is hereby incorporated by reference into this application.

BACKGROUND OF THE INVENTION

1. Field of the Invention

The present invention relates to a plasma processing apparatus for processing a substrate sample such as a semiconductor wafer placed in a process chamber within a vacuum vessel by a plasma formed in the process chamber. The present invention also relates to a diagnosis method of a plasma processing apparatus for diagnosing the operation of a flow-rate controller that controls the flow rate of a process gas supplied to the process chamber of the plasma processing apparatus.

2. Description of the Related Art

A plasma processing apparatus has been widely used for forming the structure of a device circuit by applying a desired process to a substrate sample such as a silicon semiconductor wafer or an LCD substrate in the process of manufacturing semiconductor devices. The plasma processing apparatus forms a plasma by exciting a process gas of one or a plurality of types of gases introduced into a process chamber placed in a vacuum vessel by the electric field or magnetic field supplied to the process chamber. Then, the plasma processing apparatus performs etching or other processes by using charged particles such as ions and highly reactive particles in the plasma.

In the process of the plasma processing apparatus described above, it is necessary to stabilize the flow rate of a plurality of process gases to be introduced, and to reproducibly supply the process gases. In recent years, the types of process gases used for manufacturing semiconductor devices as well as the conditions used for processing the flow rate and the like have been diversified. In these circumstances, it is required to achieve the conditions of a wide range of flow rates from large to small flow rates in one process chamber to process the sample. For this reason, the process gases of a wide range of flow rates (speeds) are supplied by using a flow-rate controller of one type and configuration.

In such apparatus, it is necessary to detect a very small value of the flow rate of the process gas, in order to stably and reproducibly achieve the small value of the flow rate of the process gas. Thus, there has been developed a process gas flow-rate controller for plasma processing apparatus including a manometer that can detect the range of low gas pressure with high accuracy, or including a flow-rate detector that can detect small flow rate with high accuracy.

An example of the related art is a semiconductor manufacturing apparatus including a mass-flow-rate controller and an opening/closing valve in a fluid feed passage with an exhaust device provided in an end thereof, which is for example described in Japanese Unexamined Patent Application Publication No. 2007-214406. The semiconductor manufacturing apparatus has a controller for controlling the operation of the mass-flow-rate controller, the opening/closing valve, the exhaust device, and the like. Then, the mass-flow-rate controller has a testing function and/or a flow-rate correction function for flow rate control.

SUMMARY OF THE INVENTION

The semiconductor manufacturing apparatus including the mass-flow-rate controller in the related art can automatically perform the mass-flow test operation. However, it does not take into account the cost and layout space. Thus, there is a problem of an increase in the size of the apparatus as the wafer diameter increases, and requiring a larger space for the gas supply system equipment.

An object of the present invention is to provide plasma processing apparatus and its diagnosis method that can diagnose the operation of the flow-rate controller with low cost and high accuracy.

The object of the present invention can be achieved by a plasma processing apparatus for processing a sample placed in a process chamber of a vacuum vessel by using a plasma formed by supplying a gas into the process chamber. The plasma processing apparatus of the present invention comprises at least three gas supply lines connected to the process chamber in parallel to allow the gas to flow through the respective gas supply lines. The plasma processing apparatus of the present invention also comprises at least three flow-rate controllers provided on the respective gas supply lines to detect the flow rate of the gas flowing through each of the gas supply lines to control the detected flow rate to a set value. The plasma processing apparatus of the present invention has a function of splitting and supplying a gas controlled to a predetermined flow rate by a third flow-rate controller, to a first flow-rate controller for the smallest detectable range of the three flow-rate controllers and a second flow-rate controller, in order to test the operation of the control of the flow rate by the first flow-rate controller, based on the value obtained from the flow rate of the gas flowing through the second flow-rate controller and from the predetermined flow rate.

According to the present invention, in the diagnosis method of the process gas supply system in the vacuum processing apparatus using large and small flow rate process gases, it is possible to diagnose a flow-rate controller for the small flow rate with ease and low cost, by using the existing supply lines for N2 purge and process gases as well as their flow-rate controllers, without using the dedicated mass-flow-rate controller.

DETAILED DESCRIPTION OF THE INVENTION

Hereinafter, an embodiment of the present invention will be described with reference to the accompanying drawings. The present invention is plasma processing apparatus including: a process chamber in a vacuum vessel to which an exhaust device such as a vacuum pump is connected; a gas supply source for supplying a purge gas to the process chamber to push the gas out of the process chamber to replace the gas inside the process chamber with the purge gas; a purge gas valve provided on a gas line for supplying the purge gas to open and close the passage of the gas line; a detector for detecting the flow rate of the purge gas; gas supply sources for supplying a plurality of process gases to the process chamber; process gas valves provided on the gas lines through which the process gases flow to the process chamber, to open and close the respective gas lines; flow-rate controllers for controlling the flow rate of the process gases; and a control unit for controlling the operations of the purge gas valve, the process gas valves, the exhaust device, and the flow-rate controllers. Further, the plasma processing apparatus according to the present invention diagnoses the flow-rate controller, based on the output from the detector that detects the flow rate of the purge gas flowing through the gas line for the process gas with the flow-rate controller set to a predetermined opening angle. In particular, the plasma processing apparatus diagnoses the operation of the flow-rate controller, by correcting the difference between the conversion factor of the purge gas and the conversion factor of the process gas by the control unit, converting the flow rate of the purge gas into the flow rate of the process gas by the output from the detector, and detecting the flow rate of the gas flowing through the flow-rate controller.

EMBODIMENT

An embodiment of the present invention will be described with reference to FIGS. 1 to 9. A plasma processing apparatus according to the embodiment is s plasma etching apparatus for performing an etching process of a substrate sample such as a semiconductor wafer placed in a process chamber that is placed in a vacuum vessel, using a plasma formed from a process gas that is supplied to the process chamber and excited by the electric filed or magnetic field introduced into the process chamber.

Figure 1:
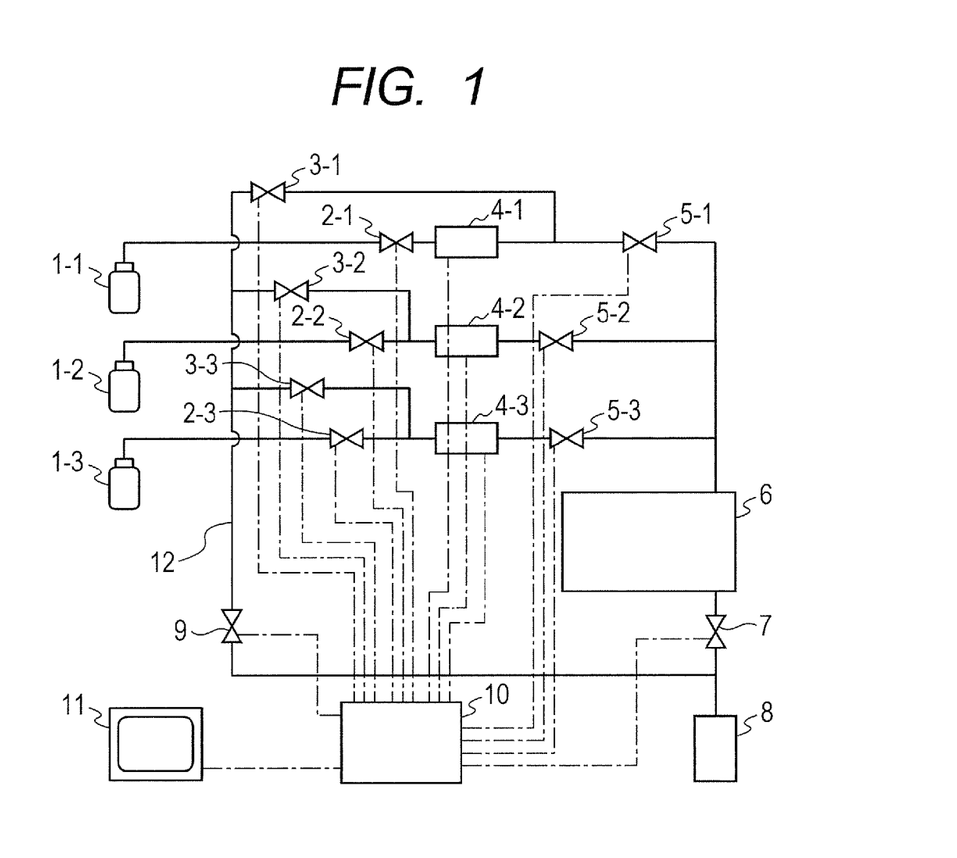
FIG. 1 is a schematic block diagram showing plasma processing apparatus according to an embodiment of the present invention.

FIG. 1 is a schematic block diagram showing the configuration of the plasma processing apparatus according to the embodiment of the present invention. FIG. 1 schematically shows the connection of supply lines including pipes for supplying purge and process gases, to the process chamber within the vacuum vessel and to the exhaust system including a vacuum pump for exhausting the process chamber in the plasma processing apparatus according to the embodiment of the present invention.

In FIG. 1, a process chamber 6 placed in a vacuum vessel is connected to an exhaust unit including a vacuum pump for exhausting the process chamber 6 on the lower side thereof. Then, the process chamber 6 is connected to the gas supply lines for supplying purge and process gases to the process chamber 6. The exhaust unit is the device for depressurizing the inside of the process chamber 6 by exhausting gases and particles in the process chamber 6, to control the pressure of the process chamber 6 to a predetermined pressure range. A vacuum pump 8 is connected to an exhaust port (not shown) provided on the lower side of the process chamber 6, through an exhaust control valve 7 connected to the exhaust port.

The gas supply line according to this embodiment includes a gas A supply line for purge gas, a gas B supply line for process gas, and a gas C supply line for process gas. The gas A supply line for purge gas includes a gas A supply source 1-1 having a storage unit such as a gas tank, which is located on a floor or location apart from the floor of the building in which the plasma processing apparatus is located, a gas A isolation valve 2-1 for blocking or allowing the purge gas to flow through the purge gas A line, a gas A flow-rate controller 4-1 having a function of detecting the gas flow rate to control the flow rate of the flowing gas to a predetermined range of value, and a gas A introduction valve 5-1 for introducing the purge gas into the process chamber 6. The gas A supply source 1-1, the gas A isolation valve 2-1, the gas A flow-rate controller 4-1, and the gas A introduction valve 5-1 are connected in series by pipes to the process chamber 6. Note that the gas flow rate detection function may be provided apart from the location of the flow rate controller 4-1, or provided in a different member removable from the flow-rate controller 4-1.

Further, in this embodiment, there is provided a bypass line 12 branching from the line between the flow-rate controller 4-1 and the gas A introduction valve 5-1, and is connected between an exhaust control valve 7 and the vacuum pump 8. A gas line A exhaust purge valve 3-1 is provided on the side of the gas supply line of the bypass line 12. Then, an exhaust valve 9 of the gas line is provided on the side of the vacuum pump 8.

Similarly to the gas A supply line, a gas B supply line for process gas according to this embodiment includes a process gas B supply source 1-2, a gas B isolation valve 2-2 for blocking or allowing the gas to flow through the gas B line for the process gas, a gas B flow-rate controller 4-2 for controlling the flow rate of the flowing gas to a predetermined range of value, and a gas B introduction valve 5-2 provided on the gas supply line between the gas B flow-rate controller and the process chamber 6 to open and close the gas B supply line through which the process gas flows to the process chamber 6. Further, there is a line branching from the line between the gas B isolation valve 2-2 and the gas B flow-rate controller 4-2 with the connection between the gas line A exhaust purge valve 3-1 and the valve 9 on the bypass line 12, on which a gas line B exhaust purge valve 3-2 is provided to open and close the particular line. In this way, the line for exhausting the gas B supply line or introducing the purge gas for N2 purge is formed.

Further, a process gas C supply line includes: a process gas C supply source 1-3; a gas C isolation valve 2-3 for blocking or allowing the gas to flow through the particular line for the process gas C of different type or composition; a gas line C exhaust purge valve 3-3 provided on a purge gas introduction line connected to a line for exhausting the gas within the gas C supply line or supplying an arbitrary purge gas (for example, N2), to introduce the purge gas to the gas C supply line when the valve is open and to close the introduction line when the valve is closed; a gas C flow-rate controller 4-3 for controlling and keeping the flow rate of the gas within the gas C supply line to a predetermined range of value; and a gas C introduction valve 5-3 provided on the gas supply line between the gas C flow-rate controller and the process chamber 6, to open and close the gas C supply line through which the process gas flows to the process chamber 6. Further, there is a line branching from the line between the gas C isolation valve 2-3 and the gas C flow rate controller 4-3, in which a gas line C exhaust purge valve 3-3 is formed between the gas line exhaust purge valve 3-1 and the valve 9 on the bypass line 12, to exhaust the gas C supply line or to introduce the purge gas for N2 purge.

Further, the ends of the gas A supply line, the gas B supply line, and the gas C supply line on the side of the process chamber 6 are joined together at connections as a single process gas supply line between the supply lines and the process chamber 6. Although not shown, it is possible to provide a valve on the process gas supply line including pipes connected to the gas A supply line, the gas B supply line, and the gas C supply line between their connections and the process chamber 6, in order to open and close the flow of the gas inside the process gas supply line. Further, the process gas supply line is connected to the process chamber 6. By the operation of the valves or flow-rate controllers provided on the respective lines, the following operations are possible: a plurality of gases of different types or compositions flowing through the respective lines are joined together and supplied to the process chamber 6 as a gas of one type or composition; and the gas flowing through each line is individually introduced into the process chamber 6.

Further, the valve and flow-rate controller provided on each of the gas supply lines are communicably connected to a control unit 10 not shown. Thus, the operation of the valve and the flow-rate controller is controlled according to the instruction signal from the control unit 10. The control unit 10 includes an operation unit such as a CPU of a semiconductor device, and a storage unit such as a CD-ROM for storing data by RAM, ROM, hard disk, or removable storage medium. Further, the control unit 10 also includes a communication interface connected to a wired or wireless communication unit to allow communication between the valve and the flow-rate controller, as well as a wired or wireless communication line connecting the operation unit, the storage device, and the interface to allow communication between them. Note that reference numeral 11 denotes a display monitor 11, such as a liquid crystal display or CRT, for displaying the state of the operation of the plasma processing apparatus that is detected by the control unit 10.

In such plasma processing apparatus, a sample such as a semiconductor wafer to be processed is held on a carrying device such as a robot arm (not shown), and is carried into the process chamber 6. Then, the sample is placed on a predetermined position of a sample holder or an electrode in the process chamber 6, and is held by an electrostatic chuck or other suitable substrate support. The inside of the process chamber 6 of the vacuum vessel is sealed. Then, the process gas is introduced into the process chamber 6. In the state in which the inside of the process chamber 6 is kept to a desired pressure value by a predetermined process, an electric field or a magnetic field is supplied to the process chamber 6 to excite the process gas to form a plasma. In this way, the sample is processed by the plasma. When the end of the process is detected, a purge gas such as an inactive gas is introduced into the process chamber 6 to replace the process gas with the purge gas in the process chamber 6. Then, a pre-processed sample is carried into the process chamber 6 and the processed sample is replaced with the new one.

The control unit 10 detects that a predetermined number of samples have been plasma processed or that the process is performed for a predetermined time. Then, the control unit 10 stops the sample process of the plasma processing apparatus based on the algorithm of the software stored in the storage device. Then, the control unit causes the apparatus to perform an operation (in maintenance mode) for the maintenance of the apparatus. In this maintenance, the process chamber 6 is opened with the inside pressure equal to the atmospheric pressure, and the parts in the process chamber 6 are cleaned or replaced.

In this embodiment, the gas supply lines are also maintained in the maintenance operation. In this case, first the gas A isolation valve 2-1 and the gas A introduction valve 5-1 are opened to introduce nitrogen (N2) gas as the purge gas supplied from the gas A supply source 1-1, into the process chamber 6. Then, the pressure of the inside of the process chamber 6 is increased from the depressed state, which is a predetermined vacuum state suitable for the process, to the atmospheric pressure or to a value approximate to the extent that the pressure is assumed to be the atmospheric pressure. In this embodiment, the exhaust control valve 7 is closed at this time.

Further, in the state in which the gas B isolation valve 2-2 and the gas C isolation valve 2-3 for the process gas are closed, the gas line exhaust valve 9 is opened to exhaust the remaining gas in the process gas supply lines by the operation of the vacuum pump 8. Further, the gas line A exhaust purge valve 3-1, the gas line B exhaust purge valve 3-2, and the gas line C exhaust purge valve 3-3 for purge are opened to purge the inside of the gas supply lines from which the remaining gas is exhausted, by replacing the process gas with the N2 gas.

After the maintenance of the apparatus is completed and when the process of the sample is restated in the process chamber 6, the gas B isolation valve 2-2 and the gas C isolation valve 2-3 are opened to introduce the process gas supplied from the gas B supply source 1-2 and the gas C supply source 1-3 into the process chamber 6 at a predetermined flow rate through the flow-rate controller 4-2 for the gas B and the flow-rate controller 4-3 of the gas C.

Figure 2:
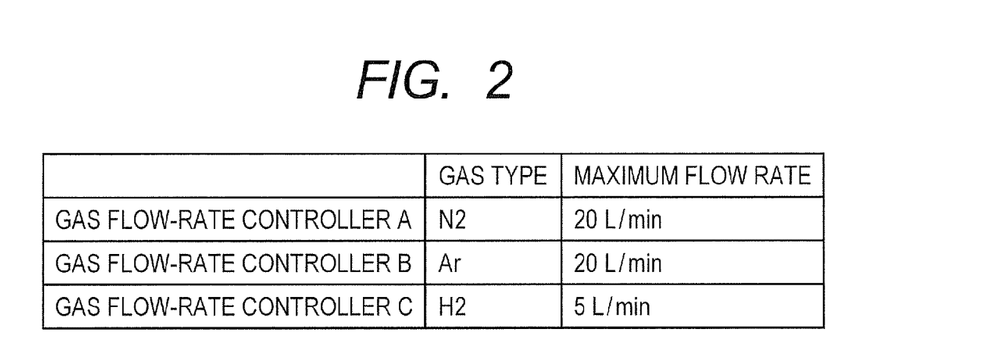
FIG. 2 is a table showing the specifications of the flow-rate controllers for purge and process gases in the embodiment shown in FIG. 1.

Note that in this embodiment, as shown in FIG. 2, the flow-rate controller 4-1 of the gas A supply line allows N2 gas to flow at the maximum flow rate of 20 L/min, and the flow-rate controller 4-2 of the gas B supply line allows Ar gas to flow at the maximum flow rate of 20 L/min. The flow-rate controller 4-3 of the gas C supply line is for H2 gas to cause a reaction for the process of the sample in the process chamber 6. Thus, the flow-rate controller 4-3 is designed to be able to control with higher accuracy in the flow rate range smaller than the flow rate range of the flow-rate controllers 4-1 and 4-2. In this embodiment, the flow-rate controller 4-3 allows the gas to flow at the maximum flow rate of 5 L/min. The gas B of Ar in this embodiment is used to dilute the gas C (H2) to a predetermined partial pressure, when the gas C (H2) is supplied to the process chamber 6 and excited to form a plasma to cause a reaction with the sample to process the sample. The gas B is introduced into the process chamber 6 with a relatively large flow rate compared to the gas C.

Figure 3:
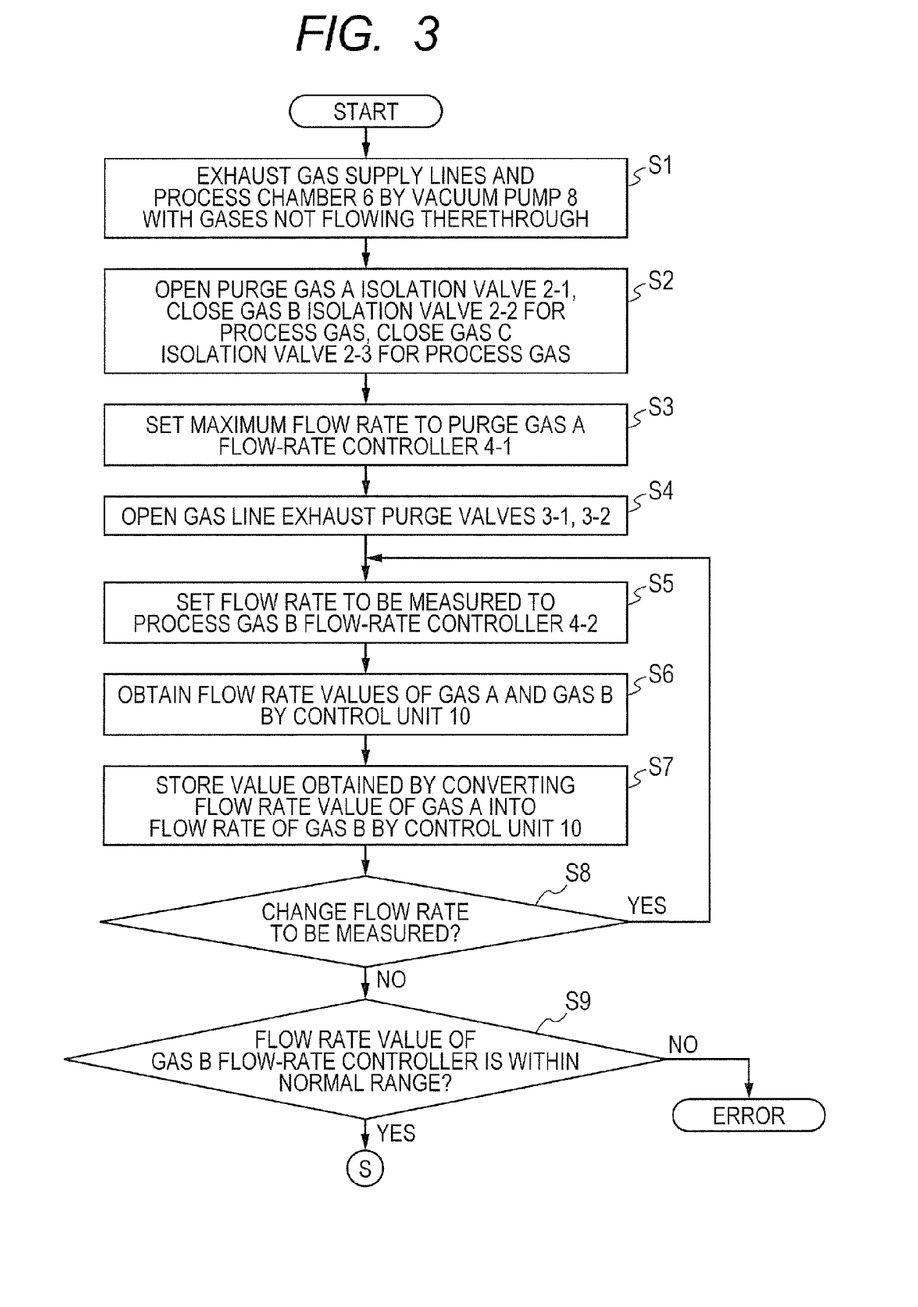
FIG. 3 is a flow chart showing the flow of the operation of diagnosing the flow rate of the flow-rate controller for the small flow-rate process gas in the embodiment shown in FIG. 1.

The operation of diagnosing the flow rate of the flow-rate controller 4-3 for the small flow rate in the plasma processing apparatus configured as described above will be described with reference to FIGS. 3 and 4. FIG. 3 is a flow chart showing the flow of the operation of diagnosing the flow rate of the flow-rate controller for the small flow-rate process gas in the embodiment shown in FIG. 1.

In this figure, first the gas process lines and the process chamber are exhausted by the vacuum pump in the state in which the gas does not flow through the gas supply lines, which is shown in step S1. Next, the N2 gas for purge is allowed to flow through a predetermined path of the gas supply line shown in FIG. 1, so that the flow-rate controller 4-2 for the large flow rate is first tested (steps S2 to S9).

Figure 5:
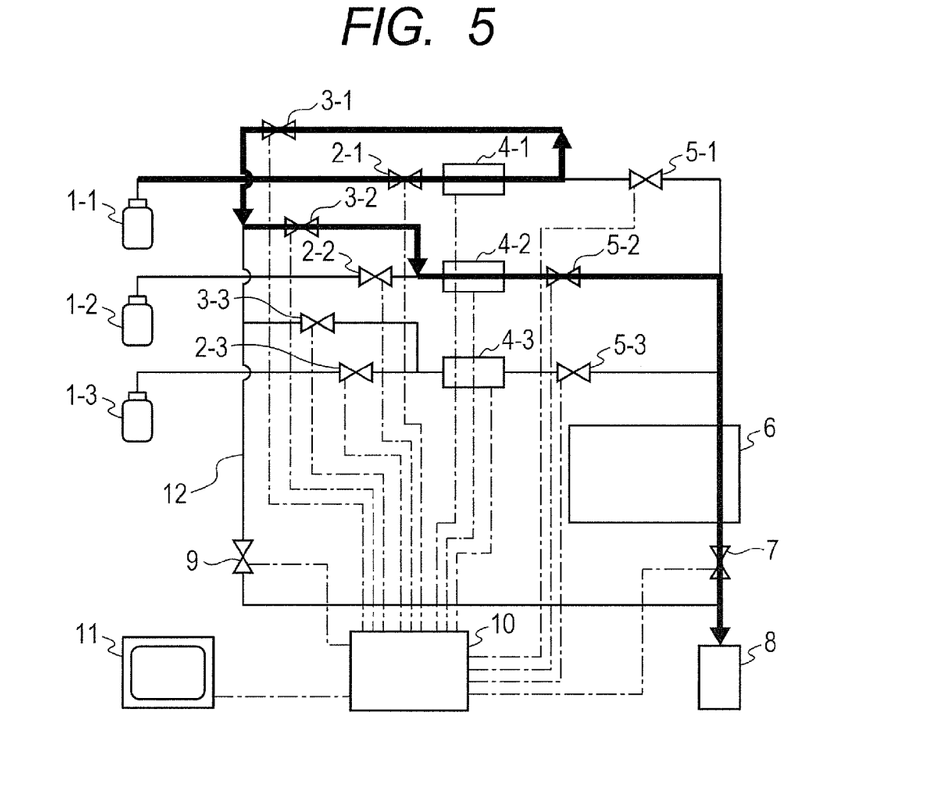
FIG. 5 is a diagram showing the flow of the gas when the flow-rate controller of the process gas is diagnosed by using the purge gas in the embodiment shown in FIG. 1.

The thick line in FIG. 5 shows the flow path through which the purge gas flows to test the flow-rate controller. In other words, the purge gas flows from the gas A supply source 1-1 to the gas B supply line through the gas A isolation valve 2-1, the flow-rate controller 4-1, the gas line A exhaust valve 3-1, and the gas line B exhaust valve. Then, the purge gas is introduced into the process chamber 6 from the process gas supply line through the flow-rate controller 4-2 and the gas B introduction valve 5-2. Then, the purge gas is exhausted by the vacuum pump 8.

In the process of steps S2 to S9, first the isolation valve 2-1 for the purge gas A (N2) is opened, and the gas B isolation valve 2-2 for the process gas B (Ar) as well as the gas C isolation valve 2-3 for process gas C (H2) are closed (step S2). Next, the flow-rate controller 4-1 for the purge gas A (N2) is set to the maximum flow rate (step S3).

Next, the gas line A exhaust purge valve 3-1 and the gas line B exhaust purge valve 3-2 are opened to introduce the purge gas A (N2) into the supply line of the process gas B (step S4). Next, the flow-rate controller 4-2 for the process gas B is set to the flow rate desired to be detected for the test of the flow-rate controller 4-2 for the process gas B (step S5). Then, the gas B introduction valve 5-2 is opened.

In this way, the gas A (N2), which is the purge gas, flows to the process chamber 6 through the flow-rate controller 4-2 of the gas B supply line. Then, the gas B introduction valve 5-2 is opened. When a predetermined time has elapsed from the time when the purge gas A (N2) starts to flow through the gas B supply line to the process chamber 6 and when the flow of the gas is steady, the detection values of the flow rate detected in the flow-rate controllers 4-1 and 4-2 are transmitted to the control unit 10 through the communication unit (step S6).

The control unit 10 detects the flow rate of the flow-rate controller 4-1 for the process gas A by using the stored software based on the received signals. Further, the control unit 10 converts the detected flow rate into the flow rate of the process gas B (Ar in this embodiment), and stores the result in a predetermined area of the storage device (step S7). It is known that when a gas is supplied to the flow-rate controller for a different gas at the same flow rate as the different gas, the gas flows differently due to the difference in the size of the gas particles, resulting in the difference in the flow rate. For this reason, the controller 10 of this embodiment performs the conversion of the flow rate to correct the difference.

Figure 6:
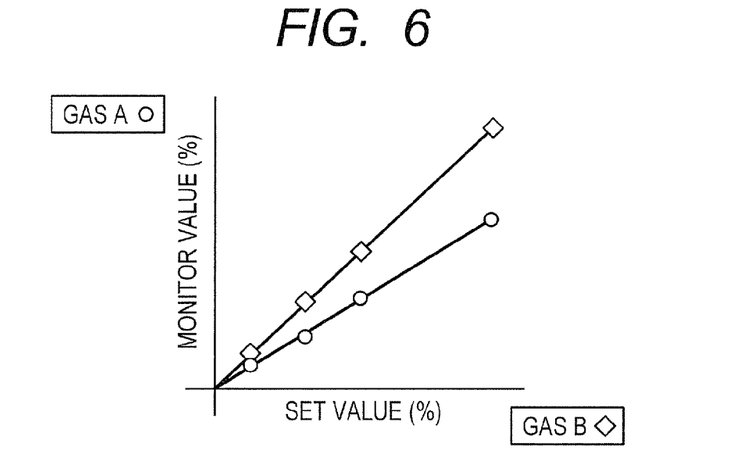
FIG. 6 is a graph showing the change in the detected value with respect to the change in the set value of the flow rate when the purge gas is allowed to flow through the flow-rate controller for the process gas in the embodiment shown in FIG. 1.

FIG. 6 shows an example of the flow rate before correction, which is received and detected by the control unit 10 in this embodiment. FIG. 6 is a graph showing the change in the detected value with respect to the change in the set value of the flow rate of the purge gas that is allowed to flow through flow-rate controller for the process gas in the embodiment shown in FIG. 1.

In this embodiment, the result of the flow rate of the purge gas N2 detected by the flow-rate controller 4-1 for the process gas Ar is corrected by the detection result of the flow-rate controller 4-1 for N2. The purge gas N2 (gas A) flows more easily than the process gas Ar (gas B). Thus, as shown in the measured value of the flow-rate controller 4-1 for the purge gas A, it is actually detected that the flow rate of the purge gas A is greater than the set value of the flow-rate controller 4-2 for the process gas B.

Figure 7:
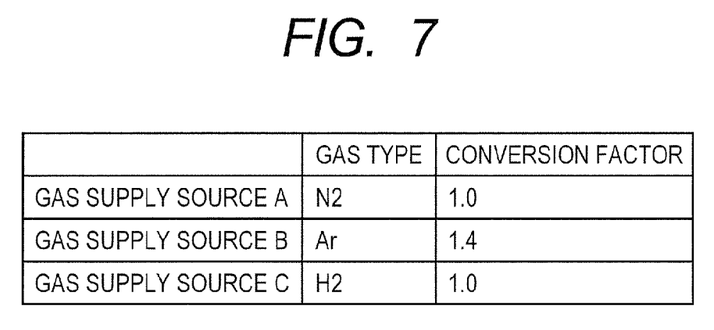
FIG. 7 is a table of the correction parameters for the flow rates of the purge and process gases with respect to a plurality of gas supply sources or gas types in the embodiment shown in FIG. 1.

In this embodiment, in order to correct such an apparent flow rate difference due to the difference in the gas, the value of the flow rate detected by the flow-rate controller to be diagnosed is corrected by a specific value. Then, the flow rate of N2, which is detected by the flow-rate controller 4-2, is converted into the value of the flow rate of the gas B (Ar in which embodiment). Hereinafter, the parameter for the correction will be referred to as the conversion factor. An example of the conversion factor is shown in FIG. 7. FIG. 7 is a table of the correction parameters for the flow rates of the purge and process gases with respect to a plurality of supply sources or gas types in the embodiment shown in FIG. 1. Here, the conversion factor of N2 (gas A) is 1.0. The conversion factor of Ar (gas B) is 1.4, whose fluidity is lower than the gas A. The conversion factor of H2 (gas C) is 1.0, whose fluidity is the same as the fluidity of the gas A.

In this embodiment, the conversion factor is obtained as a result of comparison of the difference gases flowing through the flow-rate controller with a flow rate that is accurately controlled by the flow-rate controller in advance. It is also possible to determine the conversion factor by the average value obtained as a result of repeated measurements using a plurality of flow-rate controllers. Next, the flow rate is obtained by changing the flow rate for the detection in the flow-rate controller 4-2 for the gas B, and converting by a plurality of set values. This operation is repeatedly performed in this embodiment (steps S5 to S7, S8).

In other words, in step S7, the flow rate detected by the flow-rate controller 4-1 for the process gas A is converted to the flow rate of the process gas B (Ar in this embodiment). Then, the result is stored in a predetermined area of the storage device. Then, the flow rate is detected or determined again using the flow-rate controllers 4-1 and 4-2 with respect to the different flow rate value in step 8. When it is determined that the detection of the planned set values of the flow rate has been done (NO), the process proceeds to step S9. When it is determined to be necessary to detect the flow rate with a different set value (YES), the process returns to step S5.

Figure 8:
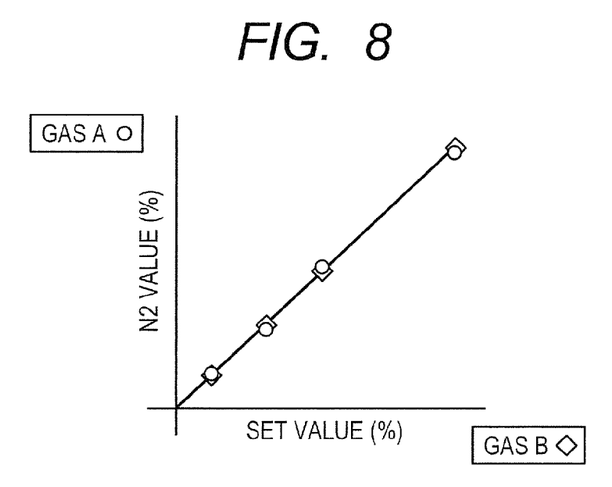
FIG. 8 is a graph of the flow rate obtained by converting the flow rate of the process gas into the flow rate of the purge gas when the purge gas is allowed to flow through the flow-rate controller for the process gas in the embodiment shown in FIG. 1.

FIG. 8 shows an example of the detection result of the flow-rate detector 4-2 that is obtained by detecting the flow rate with respect to a plurality of set values as described above. FIG. 8 is a graph of the flow rate obtained by converting the flow rate of the process gas into the flow rate of the purge gas that is allowed to flow through the flow-rate controller for the process gas in the embodiment shown in FIG. 1.

After moving to step S9, the control unit 10 determines whether the value of the flow rate detected with each set value is within a predetermined allowable range of values (for example, ±5%). Based on the result of the determination, the control unit 10 determines whether the control of the flow rate of the flow-rate controller 4-2 for the process gas B is normal (step S9).

When the control unit 10 determines that the control of the flow rate of the flow-rate controller 4-2 for the gas B is within the normal operating range (YES), the process proceeds to step S. When the control unit 10 determines the control is out of the normal operating range (NO), it is determined to be abnormal. Then, the process moves to step Error, in which the plasma processing apparatus is operated for abnormal condition.

Figure 4:
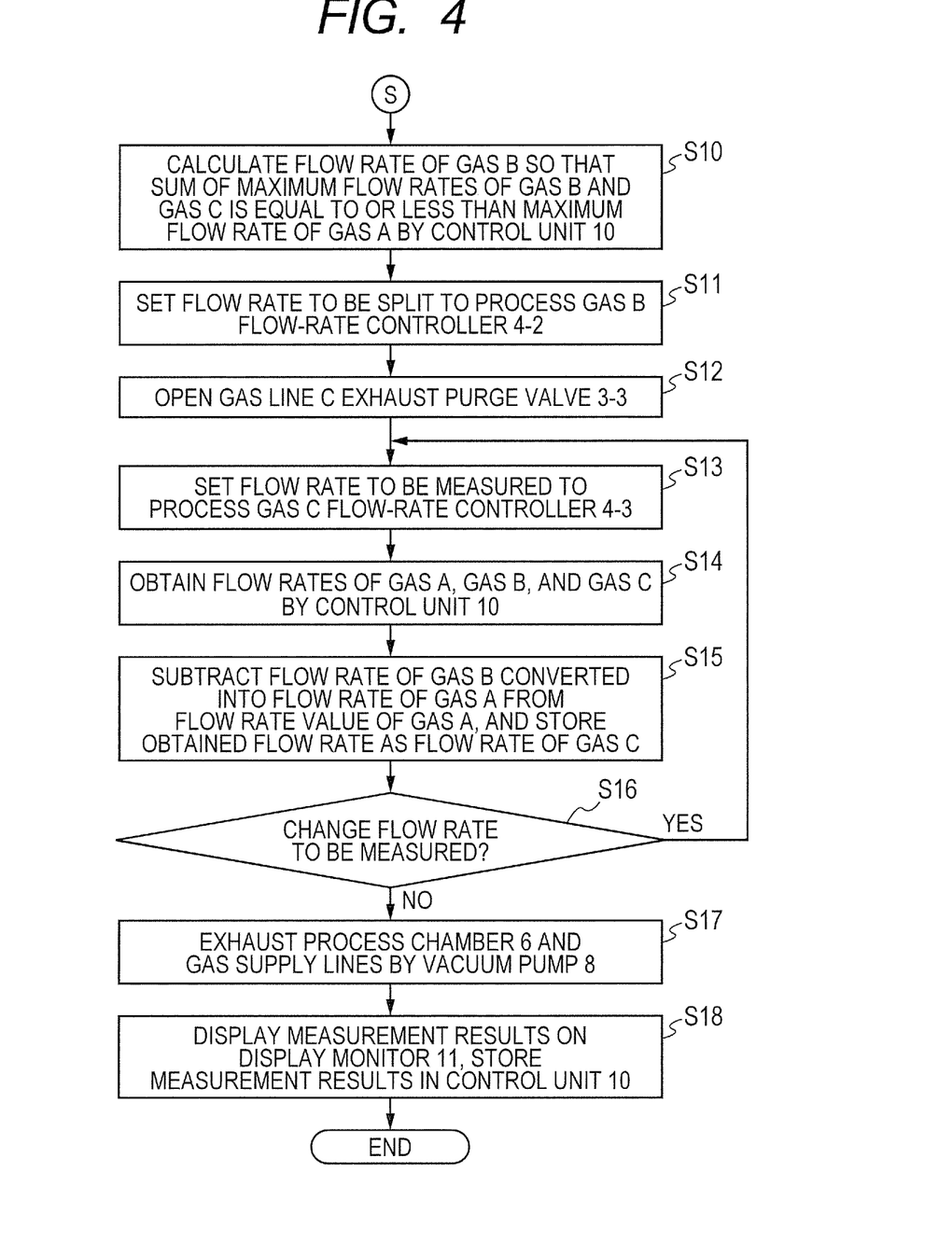
FIG. 4 is a flow chart showing the flow of the operation of diagnosing the flow rate of the flow-rate controller for the small flow-rate process gas in the embodiment shown in FIG. 1.
Figure 9:
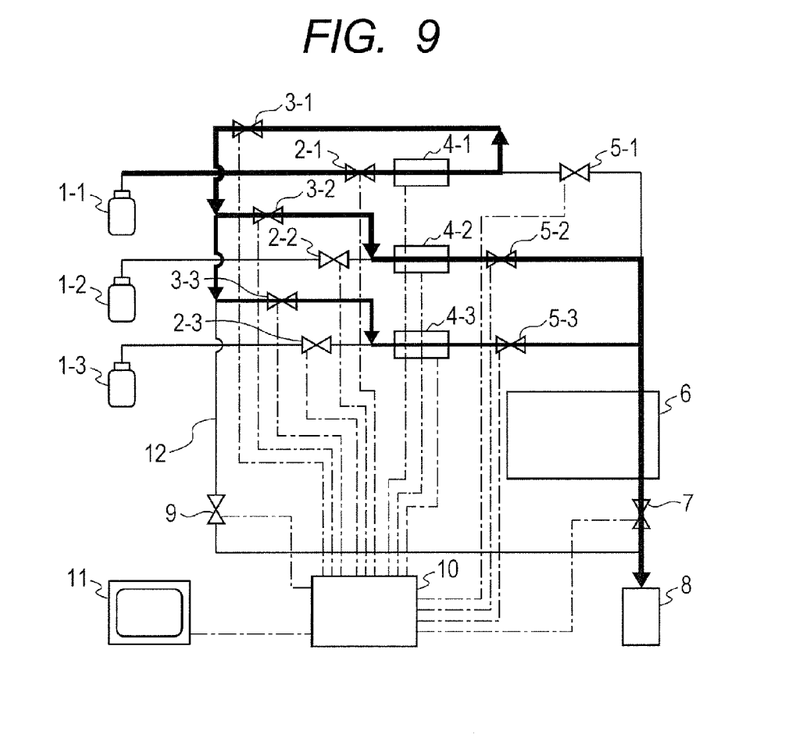
FIG. 9 is a diagram showing the flow of the gas when the flow-rate controller corresponding to the small flow rate is diagnosed by using the purge gas in the embodiment shown in FIG. 1.

Next, when it is determined in step S9 that the control is normal, the process moves to step S10 from step S9 in FIG. 4. The control unit 10 allows the N2 gas to flow through the line shown by the thick solid line in FIG. 9, and tests the flow-rate controller 4-3 for the small flow rate (steps S10 to S16). The line shown in FIG. 9 is different from the line shown in FIG. 5 in that the purge gas N2 from the gas A supply source 1-1 is introduced into both the gas B supply line and the gas C supply line, and is supplied to the process chamber 6 and exhausted to detect the flow rate in the flow-rate controller 4-3.

In the process from step S10, the control unit 10 calculates the flow rate of the flow to be split to the flow-rate controller 4-2 for the gas B, in such a way that the sum of the maximum flow rate of the flow-rate controller 4-2 for the gas B, and the maximum flow rate of the flow-rate controller 4-3 for the gas C is equal to or less than the maximum flow rate of the flow-rate controller 4-1 for the gas A (step S10). Next, the control unit 10 sets the flow rate of the flow to be split to the flow-rate controller 4-2 for the process gas B (Ar) (step S11).

Next, the control unit 10 opens the gas line C exhaust purge valve 3-3 to introduce the purge gas A (N2) into the supply line for the process gas C (step S12). Next, the control unit 10 sets the flow rate of the flow-rate controller 4-3 for the gas C to a predetermined value (step S13), and opens the gas C introduction valve 5-3. In this way, the purge gas A (N2) is introduced into the process chamber 6 through the flow-rate controller 4-3 on the gas C supply line.

Further, the control unit 10 opens the gas C introduction valve 5-3. When a predetermined time has elapsed from the time when the purge gas A (N2) starts to flow through the gas C supply line and when the flow of the gas is steady, the flow rate values detected by the flow-rate controllers 4-1, 4-2, and 4-3 are transmitted to the control unit 10. Then, the control unit 10 receives the signals (step S14). The control unit 10 converts or corrects the received flow rate values of the flow-rate controller 4-2 for the gas B and the flow-rate controller 4-3 for the gas C into the flow rate values of the gases B and C from the flow rate for the purge gas A (N2). Then, the control unit 10 stores the result (step S15). In other words, the control unit 10 detects the flow rate of the gas A (N2) flowing through the gas B supply line from the detection result of the flow-rate controller 4-2. Then, the control unit 10 detects the flow rate of the gas A flowing through the gas C supply line, from the value obtained by subtracting the detection result of the flow-rate controller 4-2, from the flow rate controlled to a predetermined value by the flow-rate controller 4-1. Further, the control unit 10 detects the flow rate of the gas C in the flow-rate controller 4-3 by converting or correcting the flow rate of the gas A flowing through the gas C supply line. Then, the control unit 10 stores the result in the storage device of the control unit 10.

Next, in this embodiment, the control unit 10 changes the value of the flow rate detected by the flow-rate controller 4-3 for the gas C to a different one. Then, the control unit 10 detects the flow rate in the flow-rate controller 4-3 at a plurality of points (set values) by repeating steps S13 to S16. In this way, the control unit 10 similarly detects the converted flow rate. In other words, in step S15, the control unit 10 stores the value of the flow rate in the flow-rate controller 4-3 that is obtained by converting or correcting into the flow rate of the process gas C, in a predetermined area of the storage device. Then, in step S16, the control unit 10 determines whether to detect the flow rate by using the flow-rate controllers 4-1, 4-2, and 4-3, with respect to a different value of the flow rate. When it is determined that the detection of the predetermined set values of the flow rate has been done (NO), the process proceeds to step S17. When it is determined to be necessary to detect the flow rate at a different set value (YES), the process returns to step S13. When the process moves to step S17, the process chamber 6 and the gas supply lines are exhausted by the vacuum pump 8 (step S17).

Figure 10:
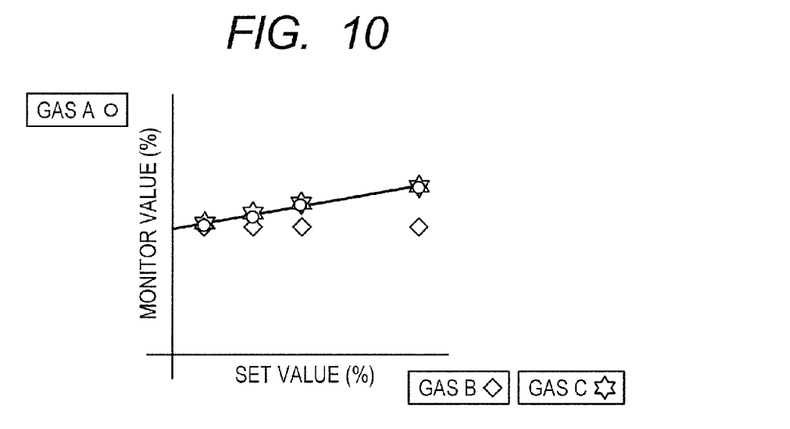
FIG. 10 is a graph of the results of diagnosing the flow rate of the flow-rate controller for the small flow-rate process gas, by allowing the purge gas to flow through a plurality of flow-rate controllers of the small flow-rate process gas.

FIG. 10 shows the flow rate obtained by the above steps with respect to a plurality of set values of the flow rate. FIG. 9 is a diagram showing the flow of the gas when the flow-rate controller corresponding to the small flow rate is diagnosed by using the purge gas in the embodiment shown in FIG. 1.

In the example shown in this figure, the flow rate set to the flow-rate controller 4-3 for the process gas C of the small flow rate is changed while the flow rate of the flow-rate controller 4-2 for the process gas B is constant. In this case, the flow rate value detected by the flow-rate controller 4-1 for the purge gas A is changed according to the change in the flow rate set to the flow-rate controller 4-3. Here, the control unit 10 determines whether the flow rate value is within the allowable range of values (±5%) at each point. This makes it possible to determine whether the flow rate value of the flow-rate controller 4-3 for the process gas C is within the normal range.

In the embodiment described above, in a plurality of gas supply lines through which the gases of different types or compositions flow, the test of the control of the flow rate of the flow-rate controller provided on one gas supply line is detected by the values of the flow rate in a plurality of flow-rate controllers provided on other gas supply lines. In particular, when the range of the flow rate that can be detected with the allowable accuracy of the particular flow-rate controller on one gas supply gas line is significantly smaller than the range of the flow rate that can be detected with the allowable accuracy of the flow-rate controllers on the other gas supply lines, the plasma processing apparatus allows the gas to flow with any value of the flow rate in the range in which the flow rate can be detected with the allowable accuracy of the flow-rate controllers on the other gas supply lines. At the same time, the plasma processing apparatus allows the gas to flow in the range of flow rate that can be detected with the allowable accuracy of the particular flow-rate controller on one gas supply line. As a result, it is possible to diagnose the operation of the particular flow-rate controller without damaging the detection accuracy.

In particular, in this embodiment, in the flow-rate controllers 4-1, 4-2, and 4-3 provided on the three gas supply lines connected to the process chamber 6 in parallel, the maximum detectable flow rate with the allowable accuracy of the flow-rate controller 4-3 is 5 L/min, and the maximum flow rate of the other two flow-rate controllers 4-1 and 4-2 is 20 L/min. In the flow-rate controllers whose detectable flow rate ranges with maintained accuracy are significantly different and at least do not overlap entirely, in general, one flow-rate controller with the detectable range greater than the detectable range of the other flow-rate controller may not accurately detect the flow rate in the detectable range that does not overlap the range of the other flow-rate controller. In this embodiment also, the upper limit of the detectable range of the flow rate of the flow-rate controller 4-3 is smaller than the lower limit of the detectable range of the other two flow-rate controllers 4-1 and 4-2.

An etching apparatus is an example of such plasma processing apparatus including a plurality of gas supply lines having the flow-rate controllers with different detectable ranges. The etching apparatus supplies a highly reactive gas as a process gas into a high vacuum process chamber to process a sample such as a semiconductor wafer. When the sample is not placed in the process chamber and the plasma is not formed to process the sample, the etching apparatus supplies an inactive gas such as Ar or N2 into the process chamber to replace the process gas with the inactive gas. The pressure maintained during the process is high vacuum. Thus, it is necessary to introduce the highly reactive process gas into the process chamber at a small flow rate with high accuracy. Consequently, the detectable range of the flow rate required to the flow-rate controller on the gas supply line for the particular process gas is a small value.

On the other hand, the gas, which is introduced to replace the process gas in the process chamber 6, is supplied when the process is not performed at a relatively high flow rate, in order to complete the conversion for a short time to increase the efficiency of the process. Thus, the detectable flow rate range for the flow-rate controller on the gas supply line for the purge gas is also large. In this embodiment, the detectable range of two flow-rate controllers is large. The gas supply lines with the flow-rate controllers for the large flow rate are connected to the gas supply line with the flow-rate controller for the small value in the particular detectable range. Then, the gas is supplied to one of the two flow-rate controllers that is controlled to a predetermined flow rate, to detect the flow rate of the gas. Then, the gas is split and supplied to both the other flow-rate controller and the particular flow-rate controller, to detect the flow rate in the respective flow-rate controllers. At this time, the flow rate of the one flow-rate controller is smaller than the sum of the maximum values of the detectable range of the other flow-rate controller and the detectable range of the particular flow-rate controller.

The gas is supplied to the gas supply line on which the one flow-rate controller is provided, with the flow rate controlled to a predetermined value by this flow-rate controller. Then, the gas is split and supplied to the gas supply line on which the other flow-rate controller is provided, and to the gas supply line on which the particular flow-rate controller is provided. At this time, the flow rate of the gas flowing through each gas supply line is controlled to a value set by its flow-rate controller. The gas with the controlled flow rate is introduced into the process chamber 6. Then, the gas is exhausted from the process chamber 6 by the operation of the vacuum pump 8.

In this embodiment, the flow rate set by the particular flow-rate controller is smaller than the value of the flow rate set by the other flow-rate controller, and is smaller than the lower limit of the detectable range of the other flow-rate controller. In this state, the flow rate of the gas supplied to the gas supply line on which the particular flow-rate controller is provided is detected as the difference of the detected flow rates of the gas flowing through the other two flow-rate controllers. Thus, it is possible to determine whether the flow rate of the gas in the flow-rate controller for the small flow rate and its set value are within the range of allowable error, by supplying the gas to each flow-rate controller at a flow rate in the allowable range of the flow-rate controller, without detecting at a flow rate in the range of low accuracy. In other words, it is possible to test or diagnose the operation of the control of the flow rate.

In particular, in this embodiment, the test or diagnosis is performed on the operation of the control of the flow rate of the flow-rate controller 4-3 for the gas C with the smallest flow rate, by first setting the set value of the flow rate of the flow-rate controller 4-3 to the maximum value that can be detected. Further, the other two flow-rate controllers are tested to determine that their accuracy is within the allowable range. Then, the flow-rate controller 4-3 in which the flow rate is tested and diagnosed is set to a plurality of flow rates. In this way, the flow rate of the flow-rate controller 4-3 is tested.

In the test of the particular flow-rate controller, the gas flow rate set to the other two flow-rate controllers is the value within the detectable range of the respective two flow-rate controllers. The bypass line 12 branching from the line between the gas A flow-rate controller 4-1 and the gas A introduction valve 5-1 on the gas A supply line is connected between the exhaust control valve 7 and the vacuum pump 8. The bypass line 12 is connected to the line branching from the gas B supply line between the gas B flow-rate controller 4-2 and the gas B isolation valve 2-2 on the gas B supply line. The bypass line 12 is also connected to the line branching from the line between the gas C isolation valve 2-3 and the flow-rate controller 4-3 on the gas C supply line. In this configuration, the gas flowing from the gas A supply line through the bypass line 12 can be split and supplied to both the flow-rate controllers 4-2 and 4-3 at a predetermined flow rate, by the control of the opening and closing of the gas line exhaust purge valve 3-2 and the gas line exhaust purge valve 3-3 with the exhaust valve 9 closed.

Further, N2 gas, which is the gas A supplied to the bypass line 12, is introduced into the process chamber 6. Then, the gas A is exhausted to the outside of the process chamber 6 by the operation of the vacuum pump 8. Because the gas A for the test is introduced into the process chamber 6, the change in the pressure of the gas in the bypass line 12 and the gas supply lines is reduced, further increasing the stability and accuracy of the detection of the flow rate in the flow-rate controllers 4-1, 4-2, and 4-3.

With the configuration described above, it is possible to accurately test or diagnose the flow-rate controller 4-3 for the small flow rate in the detectable range.

The reference numerals used in the drawings of the embodiment according to the present invention are described again below.

1-1: Gas A supply source
1-2: Gas B supply source
1-3: Gas C supply source
2-1: Gas A isolation valve
2-2: Gas B isolation valve
2-3: Gas C isolation valve
3-1: Gas line A exhaust purge valve
3-2: Gas line B exhaust purge valve
3-3: Gas line C exhaust purge valve
4-1: Flow-rate controller
4-2: Flow rate controller
4-3: Flow rate controller
5-1: Gas A introduction valve
5-2: Gas B introduction valve
5-3: Gas C introduction valve
6: Process chamber
7: Exhaust control valve
8: Vacuum pump
9: Exhaust valve
10: Control unit
11: Display monitor
12: Bypass line

The invention claimed is:

1. A diagnosis method of a plasma processing apparatus for processing a sample to be processed that is placed in a process chamber within a vacuum vessel by a plasma formed from a gas supplied to the process chamber, while controlling the flow rate by a flow-rate controller, wherein the plasma processing apparatus comprises:

a first, second, and third gas supply line, each gas supply line connected to the process chamber in parallel to allow the gas to flow through the supply lines; and a first, second, and third controller, each provided on the respective gas supply lines to detect the flow rate of the gas flowing through each of the gas supply lines and to control the flow rate to a set value, wherein the range of detectable flow rate for the third flow rate controller is smaller than the detectable range of flow rates for the first and second flow rate controllers, and wherein the diagnosis method comprises the steps of:

splitting and supplying a gas controlled to a predetermined flow rate by the third flow-rate controller, to the first flow-rate controller and to the second flow-rate controller; and testing the operation of the control of the flow rate by the first flow-rate controller, based on the value obtained from the flow rate of the gas flowing through the second flow-rate controller and from the predetermined flow rate.

2. The diagnosis method of plasma processing apparatus according to claim 1, wherein the diagnosis method tests the operation of the control, based on the result of the comparison of the difference between the detection result of the flow rate of the gas flowing through the second flow-rate controller and the predetermined flow rate, with the set value of the flow rate of the first flow-rate controller.

3. The diagnosis method of plasma processing apparatus according to claim 1 or 2, wherein at least a portion of the first flow rate controller's detectable flow rate range does not overlap the detectable range of the second or third flow rate controller and wherein the set value of the flow rate of the first flow-rate controller is within the not-overlapping range.

4. The diagnosis method of plasma processing apparatus according to claim 1 or 2, wherein the flow rate set to the second flow-rate controller as well as the predetermined flow rate of the third flow-rate controller belong to the detectable range of the respective flow-rate controllers, and wherein the set value of the flow rate of the first flow-rate controller is equal to the difference between the flow rate set to the second flow-rate controller and the predetermined flow rate.

5. The diagnosis method of plasma processing apparatus according to claim 1 or 2, wherein the first flow-rate controller performs controlling the flow rate of a reactive gas of the gases introduced into the process chamber that reacts with the sample to process the sample, and the second flow-rate controller performs controlling the flow rate of a dilution gas supplied to the process chamber, together with the reactive gas during the processing of the sample in the process chamber, and, when the sample processing in the process chamber is not performed, wherein the third flow-rate controller controls the flow rate of a replacement gas that is introduced into the process chamber.

* * * * *